(12) United States Patent
Haggart, Jr. et al.

(10) Patent No.: US 6,589,099 B2
(45) Date of Patent: Jul. 8, 2003

(54) METHOD FOR CHEMICAL MECHANICAL POLISHING (CMP) WITH ALTERING THE CONCENTRATION OF OXIDIZING AGENT IN SLURRY

(75) Inventors: David Weston Haggart, Jr., Scottsdale, AZ (US); John Maltabes, Austin, TX (US); Karl Emerson Mautz, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/901,365

(22) Filed: Jul. 9, 2001

(65) Prior Publication Data

US 2003/0008599 A1 Jan. 9, 2003

(51) Int. Cl.$^7$ ............................................... B24B 19/00
(52) U.S. Cl. ............................. 451/41; 451/36; 451/11; 438/692; 156/345.12; 156/345.16
(58) Field of Search ............................. 451/36, 41, 10, 451/11; 438/691, 692, 693; 156/345.11, 345.12, 345.16

(56) References Cited

U.S. PATENT DOCUMENTS

| | | | |
|---|---|---|---|
| 5,244,534 A | 9/1993 | Yu et al. ...................... 156/636 |
| 5,700,180 A | 12/1997 | Sandhu et al. ................. 451/5 |
| 5,846,398 A * | 12/1998 | Carpio ....................... 205/775 |
| 5,897,375 A | 4/1999 | Watts et al. ................. 438/693 |
| 5,980,775 A | 11/1999 | Grumbine et al. ......... 252/79.1 |
| 5,985,045 A | 11/1999 | Kobayashi |
| 6,001,730 A | 12/1999 | Farkas et al. ................ 438/627 |
| 6,066,030 A | 5/2000 | Uzoh |
| 6,066,266 A | 5/2000 | Osugi |
| 6,068,787 A | 5/2000 | Grumbine et al. ......... 252/79.1 |
| 6,070,600 A | 6/2000 | Grootegoed et al. |
| 6,117,783 A | 9/2000 | Small et al. ................. 438/693 |
| 6,326,299 B1 * | 12/2001 | Homma et al. ............. 438/633 |
| 6,403,468 B1 * | 6/2002 | Sugai ........................ 438/633 |
| 6,413,288 B2 * | 7/2002 | Yancey ....................... 51/309 |
| 6,432,828 B2 * | 8/2002 | Kaufman et al. ........... 438/693 |
| 6,436,829 B1 * | 8/2002 | Layadi et al. ............... 438/691 |

FOREIGN PATENT DOCUMENTS

| | | |
|---|---|---|
| EP | 1085067 A1 | 3/2001 |
| JP | 06106478 | 4/1994 |
| JP | 2000068272 | 3/2000 |
| JP | 2000306869 | 11/2000 |
| JP | 2001085376 | 3/2001 |

* cited by examiner

Primary Examiner—Eileen P. Morgan

(57) ABSTRACT

Chemical mechanical polishing (CMP) a metal film (155) at the surface of a substrate (150), with mixing a slurry precursor (201) with an oxidizing agent (202) to provide a slurry (200) with a predetermined agent concentration, and supplying the slurry to a CMP pad (140) to polish the film at a predetermined polishing rate is modified by altering the agent concentration at the end of polishing. Since the polishing rate is reduced, endpointing is enhanced. The concentration is altered by adding further oxidizing or reducing agents.

18 Claims, 2 Drawing Sheets

METHOD FOR CHEMICAL MECHANICAL POLISHING (CMP) WITH ALTERING THE CONCENTRATION OF OXIDIZING AGENT IN SLURRY

FIELD OF INVENTION

The present invention generally relates to semiconductor manufacturing and, more particularly, to chemical-mechanical polishing (CMP) of metal films.

BACKGROUND OF THE INVENTION

Chemical-mechanical polishing (CMP) removes material from the top layer of a substrate in the production of ultra-high density integrated circuits. Often, the top layer is a metal film, but other materials can also be removed. In a typical CMP process, the top layer is exposed to an abrasive medium under controlled chemical, pressure, velocity, and temperature conditions. Conventional abrasive media comprises slurry solutions and polishing pads. The slurry solution can be provided shortly before use by mixing a so-called precursor with an oxidizing agent. The precursor lacks the oxidizing agent, but comprise the other components of the slurry (e.g., abrasive media, catalysts, water).

It is required that material is removed only to a predetermined film thickness; any further removal must be prevented. Endpointing techniques are used to determine whether the desired thickness has been reached or not. The polishing rate—that means the decrease of film thickness with the time—is very crucial. When the polishing rate is too high, the endpoint is easily missed; when the polishing rate is too low, the overall CMP processing time becomes too long.

The present invention seeks to provide an improved method which mitigates or avoids disadvantages and limitations of the prior art.

DETAILED DESCRIPTION OF A PREFERRED EMBODIMENT

According to the present invention, the concentration of an oxidizing agent in the slurry is changed during polishing, but preferably, before polishing stops, so that endpointing can be performed at a decreased polishing rate.

Figure 1:
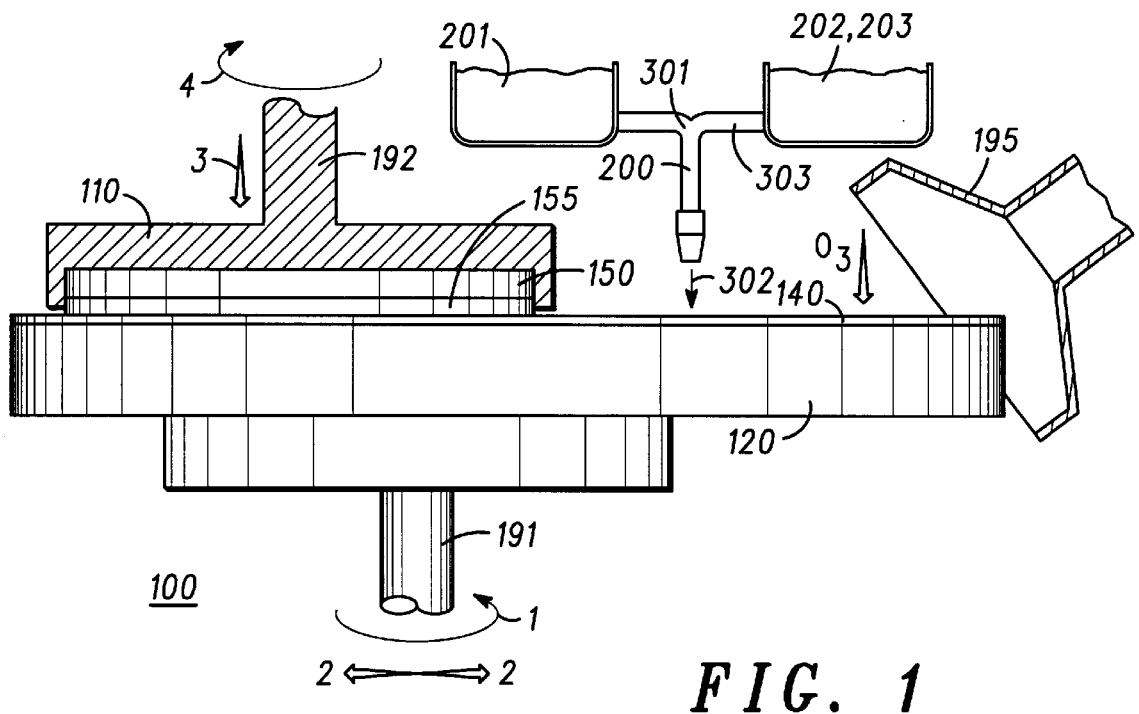
FIG. 1 illustrates a simplified diagram of a CMP processing tool that uses a method to polish a metal film at the surface of a substrate, according to the present invention.

FIG. 1 illustrates a simplified diagram of CMP processing tool 100 that uses the inventive method to polish metal film 155 at the surface of substrate 150. Substrate 150 has a base/bottom region which is typically a single crystalline silicon wafer. However, other semiconductor substrates can be used such as germanium, gallium arsenide, germanium silicon, silicon-on-insulator (SOI) substrates, silicon carbide substrates, epitaxial layers, polysilicon substrate, and the like. Metal film 155 can comprise tungsten (W), aluminum (Al) and copper (Cu), alone or in combination, or other metals.

Before explaining details of the invention, tool 100 is shortly introduced. As illustrated, tool 100 comprises head 110, platen 120, CMP pad 140, drive assemblies 191 and 192, and exhaust system 195. Usually, assembly 191 rotates platen 120 as indicated by arrow 1, or reciprocates platen 120 back and forth as indicated by arrow 2. Head 110 may be a weighted, free-floating carrier, or actuator assembly 192 may be attached to head 110 to impart axial and rotational motion, as indicated by arrows 3 and 4, respectively. In operation of tool 100, substrate 150 is positioned so that film 155 touches pad 140; as head 110 and platen 120 move relative to each other, slurry 200 and pad 140 polish film 155 by removing material. Means to hold substrate 150 during operation or for changing substrates, are well known in the art and therefore not shown. Slurry 200 contains small abrasive particles that abrade the surface of film 155 and chemicals that etch and oxidize this surface. Exhaust system 195 removes detrimental gases.

The present invention is now explained in connection with the symbolic representation 200–203 (material supply arrangement), 301–303 (method steps) and the explanation of the following FIGS. Further reference numbers in FIG. 1 stand for slurry precursor 201, oxidizing agent 202 and reducing agent 203, as well as 301 to symbolize mixing, 302 to symbolize supplying, and 303 for a valve to symbolize altering. Symbol $O_3$ stands for ozone gas (optional).

Figure 2:
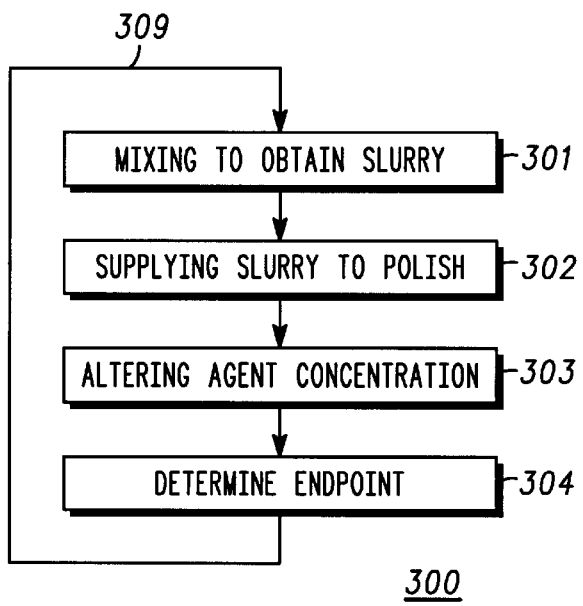
FIG. 2 illustrates a simplified method flow chart diagram of the method of the present invention.

FIG. 2 illustrates a simplified method flow chart diagram of method 300 of the present invention. Method 300 is illustrated by the following steps: 301 mixing precursor and agent to obtain slurry, 302 supplying slurry to the pad, 303 altering the agent concentration, and optionally, 304 determining the endpoint; line 309 indicates the repetition of method steps.

In detail, CMP method 300 for polishing metal film 155 at the surface of substrate 150 by using tool 100 is performed as follows: In step mixing 301, slurry precursor 201 is mixed with oxidizing agent 202 to slurry 200 that has a predetermined agent concentration (cf. line 402 in FIG. 3). In step supplying 302, slurry 200 is supplied to pad 140 to polish film 155 at a predetermined polishing rate (cf. line 502 in FIG. 4). In step altering 303, the agent concentration is altered to change said polishing rate (cf. lines 501, 503, 504 in FIG. 4).

Preferably, altering 303 the agent concentration is performed by adding further oxidizing agent 202 to slurry 200, prior to forwarding slurry 200 to pad 140. Optionally, altering 303 the oxidizing agent concentration is performed by disposing further oxidizing agent 202 to pad 140, for example, for immediate reaction with slurry 200 that is already present on pad 140.

For example, oxidizing agent 201 can be hydrogen peroxide ($H_2O_2$, i.e., a liquid) or ozone ($O_3$, i.e. a gas).

In case of ozone, its amount above pad 140 is, preferably, controlled by exhaust system 195 of tool 100 that selectively removes more or less ozone.

Altering 303 the oxidizing agent concentration by adding further oxidizing agent 202 is convenient, the effective agent concentration can optionally be altered by adding reducing agent 202 (to slurry 200).

Preferably, reducing agent 202 is ammonia ($NH_3$, as a gas) or ammonium hydroxide ($NH_4OH$, as the liquid form). Any chemical substances mentioned here that act as oxidizing or reducing agent are intended to be examples; persons of skill in the art can choose other substances with similar properties for the same purpose.

Preferably, method 300 is performed in tool 100 that polishes only a single substrate 150 at a time; pad 140 remains the same. Preferably, step altering 303 is performed simultaneously with steps mixing 301 and supplying 302; in other words, the concentration is constantly adjusted.

Persons of skill in the art are able to provide means that control the flow precursor 201, flow agents 202/203 and slurry 200, for example, by fluid meters, peristaltic pumps and the like, without the need of further explanation herein. Optionally, the pH value of slurry 200 and the oxidation/reduction potential of agents 202/203 is controlled too.

Figure 3:
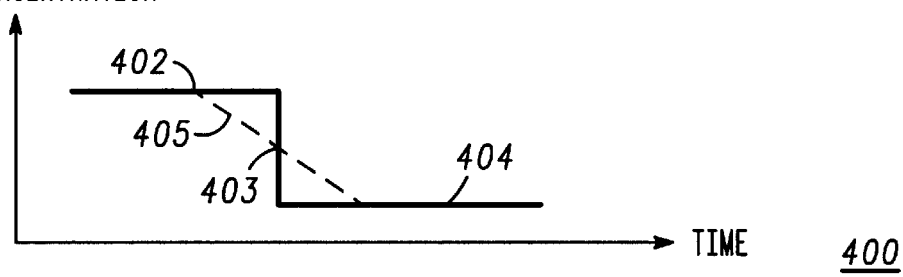
FIG. 3 illustrates a simplified diagram of an oxidizing agent concentration versus the time.

FIG. 3 illustrates simplified diagram 400 of the oxidizing agent concentration versus the time. From concentration can be changed (cf. step 303), for example, from high to low concentration (lines 402, 404) as in the figure, or vice versa (not shown). For example, altering 303 the agent concentration can be performed abruptly (line 403) or continuously (dashed line 405).

Figure 4:
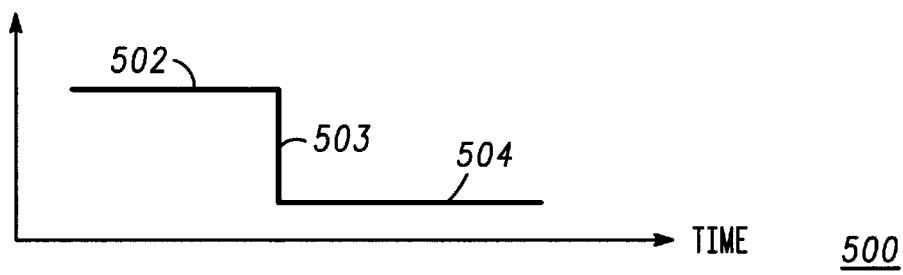
FIG. 4 illustrates a simplified diagram of a polishing rate versus the time.

FIG. 4 illustrates simplified diagram 500 of the polishing rate versus the time. The rate can be measured, for example, in nano meters per minute. For simplicity, values are not given. Altering 303 the agent concentration can cause a decrease of the polishing rate (cf. line 502 high rate, 503 decrease, and 504 low rate). When the rate is low (line 504), the determination 304 of the endpoint can be performed with higher accuracy than for the high rate.

Figure 5:
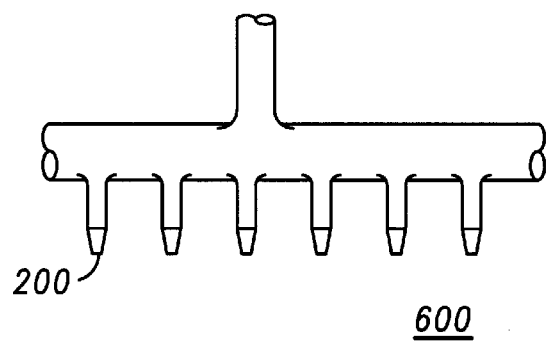
FIG. 5 illustrates a simplified diagram of a plurality of slurry injectors that are optionally used in the tool of FIG. 1.

FIG. 5 illustrates a simplified diagram of a plurality of slurry injectors 600 that are optionally used in the tool of FIG. 1. Injectors 600 are located above pad 140 to dispose further oxidizing agent through them.

In summary, the polishing rate modulation during polishing allows to gain selectivity when the endpoint approaches. As the film nears completion (based on other endpoint determining techniques or timed steps), the oxidation potential of slurry 200 is reduced to slow down (FIG. 4, 503) the polishing rate down to find the endpoint precisely.

The present invention allows to reduce the unwanted so-called dishing. Optionally, after determining 304 the endpoint, a second, significantly chemically-modified slurry is dispensed to achieve a desirable over-polish process.

While the invention has been described in terms of particular structures, devices and methods, those of skill in the art will understand based on the description herein that it is not limited merely to such examples and that the full scope of the invention is properly determined by the claims that follow.

What is claimed is:

1. A method for chemical mechanical polishing (CMP) a metal film at the surface of a substrate by using a CMP processing tool with a CMP pad, said method comprising the following steps:
    (a) mixing a slurry precursor with an oxidizing agent to provide a slurry with a predetermined agent concentration;
    (b) supplying said slurry to said pad to polish said film at a predetermined polishing rate; and
    (c) altering said agent concentration to change said polishing rate, wherein altering is performed by disposing further agent to said pad.

2. The method of claim 1, wherein further oxidizing agent is disposed through a plurality of injectors that are located above said pad.

3. The method of claim 1, wherein said oxidizing agent is hydrogen peroxide ($H_2O_2$).

4. The method of claim 1, wherein said oxidizing agent is ozone ($O_3$).

5. The method of claim 4, wherein the amount of ozone above said pad is controlled by an exhaust system of the CMP tool.

6. The method of claim 1, wherein altering said agent concentration is performed abruptly.

7. The method of claim 1, wherein altering said agent concentration is performed continuously.

8. The method of claim 1, wherein said pad remains the same.

9. The method of claim 1, wherein step (c) is performed simultaneously with steps (a) and (b).

10. The method of claim 1, wherein said oxidizing agent is ozone ($O_3$).

11. A method for chemical mechanical polishing (CMP) a metal film at the surface of a substrate by using a CMP processing tool with a CMP pad, said method comprising the following steps:
    (a) mixing a slurry precursor with an oxidizing agent to provide a slurry with a predetermined agent concentration;
    (b) supplying said slurry to said pad to polish said film at a predetermined polishing rate; and
    (c) continuously altering said agent concentration to change said polishing rate.

12. The method of claim 11, wherein altering said agent concentration is performed by adding further oxidizing agent to said slurry.

13. The method of claim 11, wherein altering said agent concentration is performed by disposing further agent to said pad.

14. The method of claim 11, wherein altering said agent concentration causes decreasing said polishing rate.

15. The method of claim 14, further comprising the determination of an endpoint.

16. The method of claim 11, wherein continuously altering said agent concentration is performed by adding a reducing agent to said slurry.

17. The method of claim 11, wherein said oxidizing agent is hydrogen peroxide ($H_2O_2$).

18. A method for chemical mechanical polishing (CMP) a metal film at the surface of a substrate by using a CMP processing tool with a CMP pad, said method comprising the following steps:
    (a) mixing a slurry precursor with ozone to provide a slurry with a predetermined agent concentration;
    (b) supplying said slurry to said pad to polish said film at a predetermined polishing rate; and
    (c) altering said agent concentration to change said polishing rate.

* * * * *